United States Patent
Bleeker

(10) Patent No.: US 6,646,274 B1
(45) Date of Patent: Nov. 11, 2003

(54) LITHOGRAPHIC PROJECTION APPARATUS

(75) Inventor: Arno J. Bleeker, New Jersey, NJ (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/505,188

(22) Filed: Feb. 16, 2000

(30) Foreign Application Priority Data

Feb. 18, 1999 (EP) .............................. 99200462

(51) Int. Cl.⁷ ..................... H01J 37/00; H01J 37/304
(52) U.S. Cl. ................. 250/492.2; 250/491.1; 250/492.1; 250/492.21; 250/492.22; 250/492.3; 355/69; 355/67
(58) Field of Search ............................ 250/492.1, 492.2, 250/492.21, 492.3, 397, 491.1, 492.22; 355/69, 67

(56) References Cited

U.S. PATENT DOCUMENTS

| | | | |
|---|---|---|---|
| 4,616,130 A | | 10/1986 | Omata |
| 4,812,661 A | * | 3/1989 | Owen ...................... 250/491.1 |
| 5,004,348 A | | 4/1991 | Magome |
| 5,673,101 A | * | 9/1997 | Tenner et al. ................ 355/53 |
| 5,989,759 A | | 11/1999 | Ando et al. |
| 6,023,068 A | * | 2/2000 | Takahashi ................ 250/492.2 |
| 6,147,355 A | * | 11/2000 | Ando et al. ............. 250/492.2 |
| 6,177,218 B1 | * | 1/2001 | Felker et al. ................ 430/30 |

FOREIGN PATENT DOCUMENTS

| | | |
|---|---|---|
| EP | 0 841 681 A2 | 5/1998 |
| JP | 10-303125 | 11/1998 |

* cited by examiner

*Primary Examiner*—John R. Lee
*Assistant Examiner*—David A. Vanore
(74) *Attorney, Agent, or Firm*—Pillsbury Winthrop LLP

(57) ABSTRACT

A lithographic projection device according to the present invention includes a first radiation source which supplies a projection beam of radiation of a first type, a mask table for holding a mask, a substrate table for holding a substrate and a projection system for imaging a portion of the mask, irradiated by the projection beam, onto a target portion of the substrate. Further, a second radiation source supplies a second beam of radiation of a second type which can be directed onto the substrate and a controller which patterns the second beam of radiation so that it impinges on the substrate in a particular pattern. The two radiation beams are controlled such that the sum of the fluxes of the radiation of the first and second type on the substrate causes an elevation of the substrate temperature which is substantially constant across at least a given area of the substrate.

30 Claims, 3 Drawing Sheets

LITHOGRAPHIC PROJECTION APPARATUS

FIELD OF THE INVENTION

The invention relates to a lithographic projection apparatus comprising:
- a radiation system for supplying a projection beam of radiation of a first type;
- a mask table for holding a mask;
- a substrate table for holding a substrate;
- a projection system for imaging a portion of the mask, irradiated by the projection beam, onto a target portion of the substrate.

In particular, the invention relates to such a device in which the radiation of the first type comprises particulate radiation (e.g. electrons or ions), X-rays or extreme ultra-violet radiation (EUV).

BACKGROUND OF THE INVENTION

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies that are successively irradiated through the reticle, one at a time. In one type of lithographic projection apparatus, each die is irradiated by exposing the entire reticle pattern onto the die at one time, such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (usually, M<1), the speed v at which the wafer table is scanned will be a factor M times that at which the reticle table is scanned. More information with regard to lithographic devices as here described can be gleaned from International Patent Application WO 97/33205, for example.

Until very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment and/or leveling measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn reduces the cost of ownership of the machine.

When radiation of the first type impinges on the substrate, energy from the radiation will generally be absorbed by the substrate, causing localized heating of the target area (die) which is being irradiated at that moment. In contrast, the substrate area outside the die, which is not being irradiated at that moment, will not undergo localized heating in this manner. Substrate heating is thus highly differential in nature, and can consequently cause significant differential stress in the substrate, with attendant mechanical deformation (expansion/contraction). This deformation can have a highly detrimental effect inter alia on the so-called overlay performance of the lithographic apparatus, which term refers to the accuracy with which a second patterned layer (new layer) can be juxtaposed upon a first patterned layer (old layer) already present on the substrate.

Although this problem is, in principle, present to some extent in all currently produced lithographic projection apparatus (in which the radiation of the first type is, for example, ultra-violet (UV) radiation with a wavelength of 365 or 248 nm), its magnitude is usually not so great as to cause substantial under-performance of the apparatus. However, a very different situation applies in the case of next-generation lithography systems, in which the radiation of the first type comprises, for example, electrons, ions, X-rays or EUV radiation (i.e. UV with a wavelength in the range 10–25 nm, e.g. 13.6 nm); in such apparatus, localized heating of the substrate can be quite intense.

It is an object of the invention to alleviate this problem. In particular, it is an object of the invention to provide a lithographic projection apparatus in which the effects of differential heating of a substrate during exposure are reduced.

These and other objects are achieved in an apparatus as specified in the opening paragraph, characterized in that the apparatus further comprises:
- a secondary source for supplying radiation of a second type, which can be directed onto the substrate;
- control means for patterning the radiation of the second type so that it impinges on the substrate according to a certain pattern.

By suitable embodiment of the control means, the sum of the fluxes of the radiations of the first and second type at substrate level will cause an elevation of the substrate temperature which is substantially constant across at least a given area of the substrate.

In essence, the invention ensures that those parts of the substrate which fall in the shadow of the radiation of the first type are illuminated (and consequently heated) by radiation of the second type, and vice versa; however, appropriate choice of the photosensitive material on the substrate, and of the type (e.g. wavelength) of the radiation of the second type, will ensure that the photosensitive material will only be exposed by the first-type radiation, and not by the second-type radiation. Proper adjustment of the second-type radiation dose at substrate level ensures that the substrate surface is heated to a substantially uniform temperature over at least that area which is to be covered with whole dies, thereby combating differential heating effects. Use of the word "substantially" in this context does not require exact uniformity of the substrate's surfacial temperature (although this is, of course, generally preferred); rather, the invention strives to produce at least some smoothing (and preferably a significant smoothing) of the differential heating effects which would occur in the absence of the invention.

The current invention can be envisaged at different levels, thus determining the size of the "given area" referred to in the penultimate paragraph above. For example, at a basic level, when one die (target area) on the substrate is being exposed to first-type radiation, the (whole) substrate area outside that die can be concurrently exposed to second-type radiation; this will be referred to hereunder as a "coarse-level correction". On a deeper level, the invention can be applied within a given die: the shadowed (masked) areas within that die are then irradiated with second-type radiation while the rest of the area within the die is exposed to first-type radiation; this will be referred to hereunder as a "fine-level correction". It is also possible to combine a coarse-level and fine-level correction.

In a first embodiment of the apparatus according to the invention, the radiation of the first type is selected from the group consisting of electrons, ions, X-rays and EUV radiation. Lithographic systems employing such post-optical radiation are presently undergoing development and preliminary testing by several companies, in reply to the semiconductor industry's continuing drive toward smaller feature sizes, and the consequent demand for greater lithographic image resolution. Preliminary investigations have shown that the use of such radiation types can lead to very substantial substrate heating, with the attendant risk of producing significant differential stresses in the substrate; consequently, the present invention represents a particularly important contribution to these technologies. More information with regard to post-optical lithographic apparatus can be obtained, for example, from:

U.S. Pat. Nos. 5,079,112 and 5,260,151, in the case of SCALPEL lithography employing an electron source;

U.S. Pat. No. 5,532,496, relating to another electron-beam lithographic apparatus;

European Patent Application EP 0 779 528 and U.S. Pat. No. 5,153,898, in the case of EUV lithography.

Nevertheless, application of the invention can also be envisaged for other highly energetic radiation types, such as UV radiation with a wavelength of 193 nm, 157 nm or 126 nm, for example.

In a particular embodiment of the apparatus according to the invention, the radiation of the second type is selected from the group formed by microwaves, infrared radiation, visible light, and ultra-violet radiation. As already stated above, the resist employed on the substrate must be substantially insensitive to the radiation of the second type. For example, in the case of electron-beam lithography and ion-beam lithography, it is possible to use one of the resists currently available for use with DUV radiation (wavelength: 248 nm); in that case, the employed second-type radiation must be one to which such DUV resists are insensitive, e.g. infra-red radiation, or visible light with a wavelength longer than yellow. On the other hand, in the case of an EUV resist, a near-UV wavelength may prove suitable for use as second-type radiation. The skilled artisan will appreciate this point, and will be able to deduce a suitable combination of resist and second-type radiation on the basis of a given first-type radiation. Moreover, it will be obvious to the skilled drawing on that teaching of the present invention artisan that:

the use of a radiation type such as microwave radiation or infrared radiation as a second-type radiation will generally only be appropriate in performing a coarse-level correction (see above). This is because these radiation types do not generally lend themselves to fine patterning/focusing at the resolution of the features typically present in a die;

the successful use of the chosen second-type radiation in performing a fine-level correction (see above) will depend on the resolution of the features being imaged using the first-type radiation; if this resolution is too fine, then the (less energetic) second-type radiation will be difficult to pattern/focus at the required resolution. In this respect, performing a coarse-level correction is much easier, since, in that case, the second-type radiation need only be patterned/focused to a resolution of the order of millimeters (the width of a die) or centimeters (the width of a wafer) rather than tens of nanometers (the width of the individual IC features within a die).

In a particular embodiment of the inventive apparatus, the control means comprise a stencil plate. As already stated above, the second-type radiation should impinge on those parts of the substrate that are in the shadow of the first-type radiation, and vice versa. This can be realized in a relatively simple manner by locating a stencil plate between the secondary radiation source and the substrate. In the case of a coarse-level correction, such a stencil plate will comprise an portion which shields a shadow-area the size of a die (or, in the case of a step-and-scan device, the size of the scanning slit-image on the substrate), while allowing radiation access to the region around the shadow-area; in use, the plate will be positioned, at any given moment during the wafer exposure, such that the shadow-area coincides with a subject die upon which imaging is occurring (with first type radiation), whereby second-type radiation is allowed to impinge on (all) areas of the wafer except the said subject die (in the case of a step-and-scan device, the second-type radiation will be allowed to impinge on the substrate area outside the (moving) slit area). In the case of a fine-level correction, on the other hand, at least part of the stencil plate should contain a pattern which is substantially a negative of the pattern to be imaged onto each die (using first-type radiation); the term "negative" here indicates that the stencil pattern is an inverse or complimentary image of the pattern to be imaged on the die.

An alternative embodiment of the apparatus according to the invention is characterized in that the control means comprise:

programmable memory means, for storing information regarding a pattern to be projected from the mask;

scanning means, for scanning a radiation beam from the secondary light source over the surface of the substrate;

attenuator means, for adjusting the intensity of the secondary light source during the said scanning motion, on the basis of the information stored in the memory means, thus causing patterned irradiation of the substrate with radiation of the second type.

In this embodiment, a beam of second-type radiation is scanned over an appropriate area of the substrate and is concurrently intensity-modulated so as to produce a patterned dose. For example, during exposure of a given die with first-type radiation, the intensity of the scanning second-type beam is kept relatively high in the shadow-areas within the die, and relatively low in the other areas within the die. Outside the die, the intensity of the second-type radiation is kept relatively high; this can be achieved not only using the said scanning technique, but also using a stencil plate, for example.

In the apparatus discussed in the previous paragraph, the memory means can be provided in one go with a "map" of the pattern to be projected from the mask; this can be done, for example, prior to an exposure session (batch), by loading a map-file into the memory means from a map library. Alternatively, the memory means can be programmed "on the fly", using a technique whereby, instead of providing a file with prior information regarding the mask pattern, such information is instead "measured" and stored in memory. In this latter case, an embodiment of the apparatus according to the invention is characterized in that the control means comprise:

measurement means, for determining the patterned intensity distribution of radiation of the first type at a reference level between the radiation system and the substrate table;

patterning means, for patterning the output of the secondary source so as to produce a second-type patterned intensity distribution at substrate level which is substantially a negative of the first-type patterned intensity distribution determined by the measurement means.

Examples of such embodiments are given in the next paragraph.

A particular embodiment of the inventive apparatus as described in the previous paragraph is characterized in that:

the radiation of the first type comprises charged particles;

the measurement means determine the patterned intensity distribution of the charged particles on the basis of a current measurement at the reference level.

In an alternative version:

the measurement means determine the patterned intensity distribution of the charged particles on the basis of a secondary electron signal measurement at the reference level.

The charged particles referred to here may be electrons or ions, for example (or, in principle, even other particles, such as protons or muons). The said reference level may, for example, be one of the following:

(a) mask level;

(b) the level of an angle-limiting aperture located in the radiation path between the mask table and the substrate table;

(c) substrate level.

More information on this point is given in the Embodiments below.

The application of the current invention will alleviate the problem of differential heating of a substrate during use of a lithographic apparatus. However, the substrate will still tend to get hot as a whole, and this can also be undesired. Fortunately, such "global" heating of the substrate is alleviated by substantial heat removal through the substrate table on which the substrate is located.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively. It will also be appreciated that the apparatus according to the invention may, if desired, contain more than one substrate table and/or more than one mask table (so-called twin-stage or multi-stage machines).

BRIEF DESCRIPTION OF THE DRAWINGS

The invention and its attendant advantages will be further elucidated with the aid of exemplary Embodiments and the accompanying schematic drawings, whereby.

In the figures, corresponding reference symbols denote corresponding parts.

DETAILED DESCRIPTION OF THE PREFERRED EMBODIMENT

Embodiment 1

Figure 1:
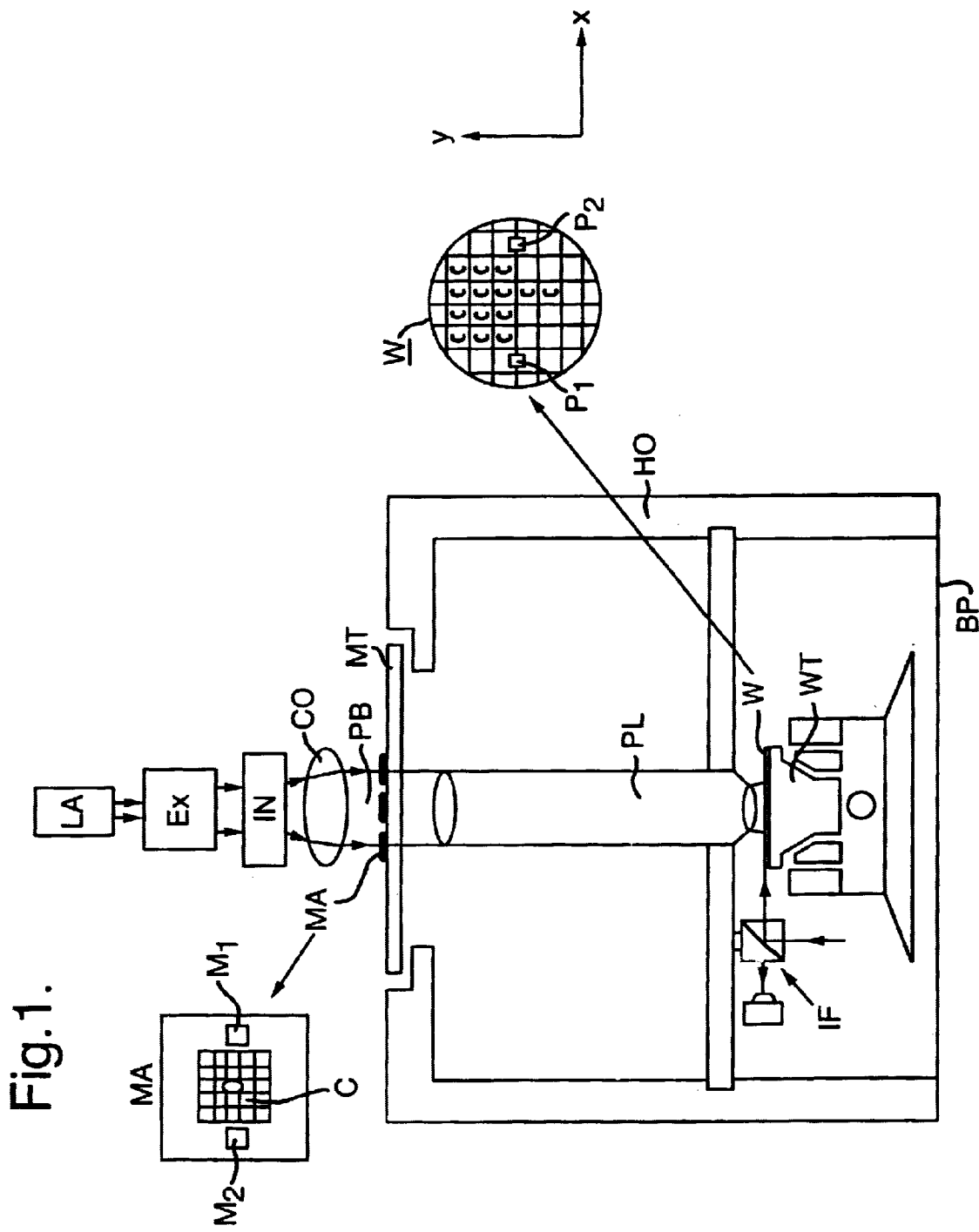
FIG. 1 schematically depicts a lithographic projection apparatus in which the present invention can be applied.

FIG. 1 schematically depicts a lithographic projection apparatus in which the current invention can be applied. The apparatus comprises:

a radiation system LA, Ex, IN, CO for supplying a projection beam PB of radiation (e.g. electrons, ions, X-rays or EUV);

a mask table MT provided with a mask holder for holding a mask MA (e.g. a reticle);

a substrate table WT provided with a substrate holder for holding a substrate W (e.g. a resist-coated silicon wafer);

a projection system PL (e.g. a mirror or catadioptric system, or a field lens) for imaging an irradiated portion of the mask MA onto a target portion C (die) of the substrate W.

As here depicted, the projection system PL and mask MA are transmissive (which is the actual situation in the case of SCALPEL, for example); however, they may alternatively be reflective (which is the situation in the case of EUV, for example).

The radiation system comprises a source LA (e.g. an electron gun or ion source, a wiggler/undulator provided around the path of a charged particle beam produced by an accelerator, or a laser source) that produces a beam of radiation. This beam is passed along various optical components,—e.g. beam shaping optics Ex, an integrator IN and a condensor CO—so that the resultant beam PB has a desired shape and intensity distribution in its cross-section.

The beam PB subsequently intercepts the mask MA which is held in a mask holder on a mask table MT. Having passed through (or been reflected from) the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB. In general, movement of the tables MT, WT will be realized with the aid of a long stroke module (course positioning) and a short stroke module (fine positioning), which are not explicitly depicted in FIG. 1. In the case of a wafer stepper as opposed to a step-and-scan device—the mask table MT may be provided with only a short-stroke module, for fine positioning.

The depicted apparatus can be used in two different modes:

In step mode, the mask table MT is fixed, and an entire mask image is projected at one time (i.e. a single "flash") onto a target area C. The substrate table WT is then shifted in the X and/or Y directions so that a different target area C can be irradiated by the (stationary) beam PB;

In scan mode, essentially the same scenario applies, except that a given target area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

Embodiment 2

In the apparatus of FIG. 1, the plan view of the wafer W at the right of the figure shows the various die areas C into which the wafer W can be subdivided. During use of the lithographic projection apparatus, these die areas C will be irradiated one at a time. In the case of a waferstepper, for example, this means that, at a given time during the exposure procedure, first-type radiation will only impinge on one particular die area C ("the subject die"), leaving the other die areas C "dark" with respect to the first-type radiation. As a result, the subject die area C will become substantially heated through absorption of first-type radiation, whereas the surrounding die areas C will remain at a lower temperature. This sizeable temperature difference can cause substantial stress in the wafer, resulting in local wafer expansion or even sudden slight movement of the wafer. In turn, this has a detrimental effect on the imaging performance of the lithographic apparatus.

In a particular embodiment (coarse-level correction) of the current invention, this problem is addressed by directing a second type of radiation onto the various die areas C around the particular subject die C that is being irradiated with the first-type radiation at a given moment. If the source LA is shuttered off (e.g. during motion of the substrate table WT or during alignment and/or levelling operations prior to exposure), then the second-type radiation can, for example:

also be shuttered off, so that no second-type radiation impinges on the wafer;

be unpatterned, so that the entire wafer face is irradiated with the second-type radiation.

Once the source LA is shuttered open again, and while it remains open, an adjustment is made to the control means to ensure that only the area of the wafer outside the subject die C will receive a flux of the second-type radiation. And so forth for each of the subject dies on the substrate W.

Figure 3:
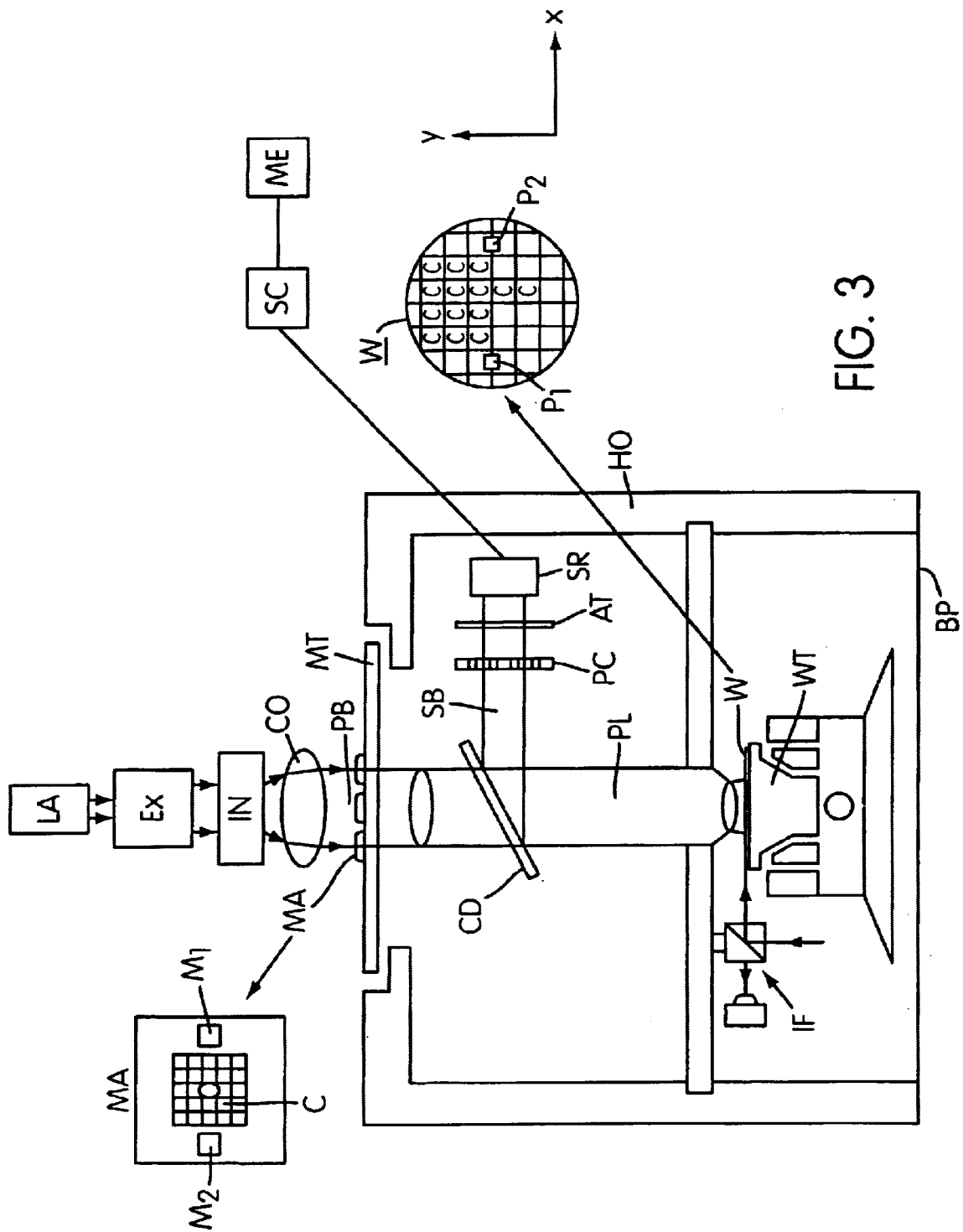
FIG. 3 schematically shows a lithographic projection apparatus using a second-type radiation source.

The second-type radiation can be conveniently directed onto the wafer W using a secondary source disposed off the optical axis of the projection system PL, or by coupling the second-type radiation into the path of the first-type radiation from the source LA, for example. As shown in FIG. 3, this latter method may employ a small mirror or prism CD, disposed near the optical axis of the projection system PL, serving to direct second-type radiation SB from the (laterally situated) secondary source SR onto a path along the optical axis and toward the substrate.

Embodiment 3

Figure 2:
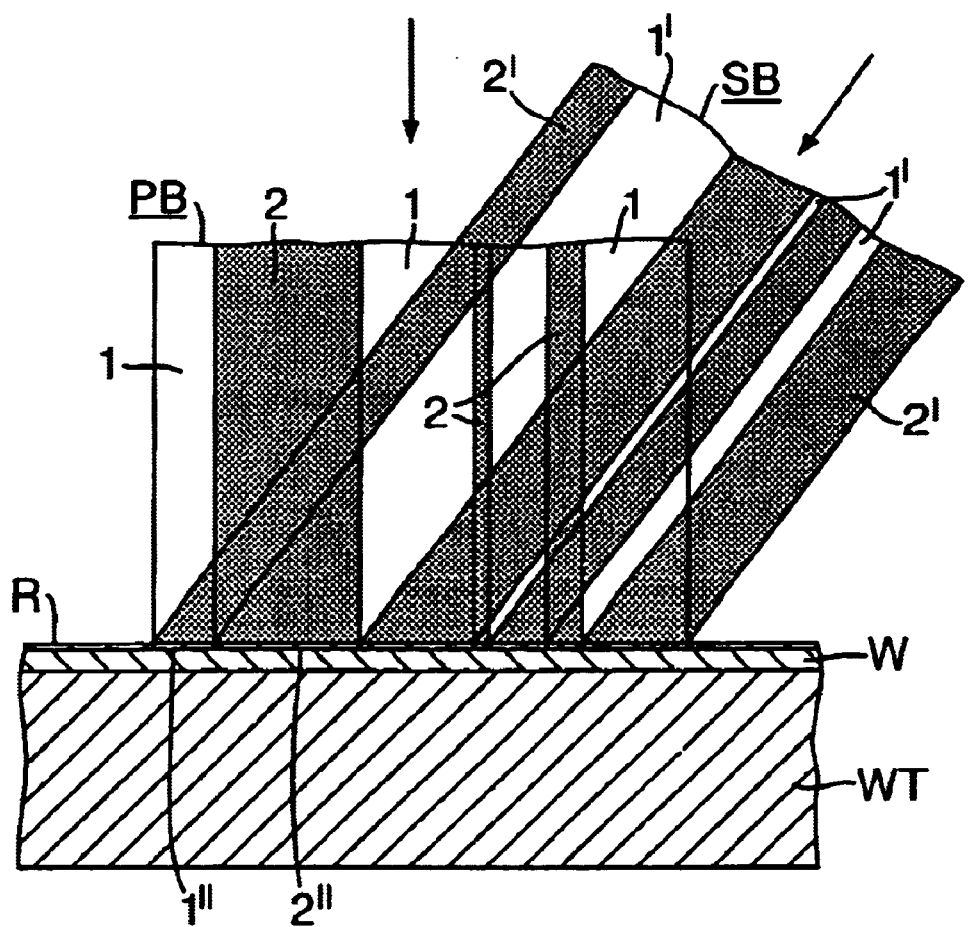
FIG. 2 renders a cross-sectional view of part of the subject of FIG. 1, and depicts thereby the principle of operation of an apparatus according to the invention.

FIG. 2 is a magnified cross-section of part of the apparatus of FIG. 1, after modification to render it in accordance with a particular embodiment of the present invention. As here depicted, the Figure schematically shows a fine-level correction (see above); however, the basic principle illustrated in the Figure and discussed hereunder apply also to a coarse-level correction.

A wafer W is coated with a resist layer R and is located on top of the wafer table WT. Also depicted is part of the projection beam PB of first-type radiation, which contains "light" regions 1 and "dark" regions 2 in accordance with the pattern on the mask MA (not depicted). The light regions 1 give rise to exposure areas 1" in the resist layer R, whereas the dark regions 2 give rise to non-exposure areas 2" in the layer R; these non-exposure areas 2" are termed as being "in the shadow" with regard to the projection beam PB.

In addition to the chemical exposure effects in the previous paragraph, the projection beam also has a thermal effect on the wafer W, since the layer R and wafer W absorb energy from the beam PB and consequently become heated. As a result, the exposure areas 1" will be heated by the projection beam PB.

The Figure additionally depicts a secondary beam SB of second-type radiation. As in the case of the projection beam PB, the secondary beam SB is patterned, and contains "light" regions 1' and "dark" regions 2'. The patterning of the secondary beam SB is such that the light regions 1' impinge upon the non-exposure areas 2" ("shadow areas") of the resist layer R, whereas the dark regions 2' fall upon the exposure areas 1".

The resist R and the radiation in the secondary beam SB are chosen such that the former is not substantially exposed by the latter; consequently, the secondary beam SB has a negligible effect on the layer R as far as chemical exposure is concerned. However, the radiation in the secondary beam SB is absorbed by the layer R and the wafer W, and causes heating of the wafer W; the non-exposure areas 2" are thus heated by the secondary beam SB. If now the intensity and nature (e.g. wavelength) of the secondary beam SB are appropriately chosen, then the temperature rise in the non-exposure regions 2" due to beam SB will be substantially equal to the temperature rise in the exposure regions 1" due to beam PB. The net effect is thus a substantially constant heating of the wafer W across its major surface, instead of the differential heating which would occur without the application of the secondary beam SB.

As depicted in FIG. 2, the exposure regions 1" and non-exposure regions 2" are located within a given die. However, there will also be non-exposure regions outside that die (viz. other dies, and intermediate strips of wafer), and these can, if desired, also be heated by a secondary beam, so as to ensure that they are kept at substantially the same temperature as the die currently being exposed.

In FIG. 2, the depicted patterning of the secondary beam SB is such as to have been caused by the use of e.g. a stencil plate (not shown). However, the secondary beam SB can also be patterned in another manner, e.g. by scanning a single beam over the resist layer R and modulating its intensity as a function of position: a relatively high intensity is then used in the non-exposure regions 2", and a much lower (or zero) intensity in the exposure regions 1".

As here depicted, the beam SB arrives at the substrate from an off-axis secondary source. In an alternative embodiment, the beam SB can impinge upon the substrate W in a direction substantially perpendicular to the plane of the substrate W; this can be achieved by coupling the beam SB into the beam PB using, for example, a mirror or prism arrangement. The beam SB itself can be derived from a lamp or laser source, and will be focused using a dedicated projection system. The skilled artisan in the field of projection lithography will know how to contrive a suitable secondary source and attendant projection system for use with a chosen second-type radiation.

Embodiment 4

In the case of an electron-beam or ion-beam lithographic apparatus, the current on/at the reticle is measured. Since the transmitted electrons or ions do not contribute to the measured current, this will be a measure of the pattern density of the reticle; in the case of a SCALPEL reticle, which in principle does not stop any electrons, a measured current difference will be the result of a difference in the generation of secondary electrons in the non-scatter regions and the high-scatter regions. The secondary radiation source can be adjusted as a function of the measured current.

Embodiment 5

In the case of an electron-beam or ion beam device (once again), the secondary electron signal from the reticle is measured. Electrons or ions that do not pass through an opening in the reticle will generate secondary electrons, which can be detected. Consequently, the measured secondary electron current is a measure of the pattern density on the reticle (this also applies to SCALPEL, on the basis of the same reasoning presented in Embodiment 3). The secondary radiation source can be adjusted as a function of the measured secondary electron current.

Embodiment 6

In the case of a lithographic projection apparatus employing the SCALPEL principle, there can be a so-called "angle-limiting aperture" located between the reticle and wafer tables. By measuring the current on, or the number of secondary and/or backscattered electrons from, this aperture, one obtains an indicator of the number of scattered electrons: the more electrons scattered, the lower the pattern density on the reticle. Once again, the secondary radiation source can be adjusted as a function of the measured current (direct or secondary/backscattered).

What is claimed is:

1. A lithographic projection apparatus comprising:
   a primary radiation source constructed and arranged to supply a projection beam of radiation of a first type;
   a mask table for holding a mask;
   a substrate table for supporting a substrate;
   a projection system that images a portion of the mask, irradiated by the projection beam, onto a target portion of the substrate while the substrate is on the substrate table;
   a secondary radiation source constructed and arranged to supply radiation of a second type, which can be directed onto the substrate while the substrate is on the substrate table; and
   a radiation pattern controller constructed and arranged to pattern said radiation of the second type so that it impinges on the substrate according to a desired pattern,
   wherein irradiation of portions of said substrate with said radiation of a first type and said radiation of a second type take place in a same chamber.

2. An apparatus according to claim 1,
   wherein the radiation system supplies the first type of radiation that is selected from the group consisting of electrons, ions, X-rays and extreme ultra-violet radiation.

3. An apparatus according to claim 1,
   wherein the secondary source supplies the second type of radiation which is selected from the group consisting of microwaves, infrared radiation, visible light, and ultra-violet radiation.

4. An apparatus according to claim 1, wherein the pattern controller comprises a stencil plate.

5. An apparatus according to claim 1,
   wherein the pattern controller comprises:
      a programmable memory for storing information regarding a pattern to be projected from the mask;
      a beam scanner constructed and arranged to scan a radiation beam from the secondary radiation source over the surface of the substrate; and
      an attenuator constructed and arranged to adjust the intensity of the secondary radiation source during scanning motion, on the basis of the information stored in the memory, thereby causing patterned irradiation of the substrate with the radiation of the second type.

6. An apparatus according to claim 1,
   wherein the pattern controller comprises:
      a measuring component constructed and arranged to determine the patterned intensity distribution of radiation of the first type at a reference level between the radiation system and the substrate table; and
      a second pattern controller constructed and arranged to pattern the output of the secondary radiation source so as to produce a second type patterned intensity distribution at substrate level which is substantially a negative of the first type patterned intensity distribution determined by the measuring component.

7. An apparatus according to claim 6, wherein:
   the radiation of the first type comprises charged particles; and
   the measuring component determines the patterned intensity distribution of the charged particles on the basis of a current measurement at the reference level.

8. An apparatus according to claim 6,
   wherein
      the radiation of the first type comprises charged particles; and
      the measuring component determines the patterned intensity distribution of the charged particles on the basis of a secondary electron signal measurement at the reference level.

9. An apparatus according to claim 6, wherein the reference level is at mask level.

10. An apparatus according to claim 6, wherein the reference level is at the level of an angle-limiting aperture located in the radiation path between the mask table and the substrate table.

11. An apparatus according to claim 6, wherein the reference level is at substrate level.

12. A device manufacturing method comprising:

providing a substrate which is at least partially covered by a layer of radiation-sensitive material;

providing a mask which contains a pattern;

using a projection beam of radiation to project an image of at least a part of the mask pattern onto a target area of the layer of radiation-sensitive material of the substrate while on a substrate table disposed in a chamber; and directing radiation of a second type onto the substrate according to a certain pattern while on the substrate table disposed in said chamber.

13. A method according to claim 12, wherein said given area is substantially a whole major surface of the substrate.

14. A method according to claim 12, wherein said given area is said target area.

15. A device manufactured using a method according to claim 12.

16. A lithographic projection apparatus comprising:

a primary radiation source constructed and arranged to supply a projection beam of a first radiation;

a mask table for holding a mask;

a substrate table for supporting a substrate;

a projection system that images a portion of the mask, irradiated by the projection beam, onto a target portion of the substrate;

a secondary radiation source constructed and arranged to supply a second radiation, which can be directed onto the substrate; and a radiation pattern controller constructed and arranged to pattern said second radiation so that it impinges on the substrate according to a desired pattern such that the sum of the fluxes of the first and second radiations at substrate level causes an elevation of the substrate temperature which is substantially constant across at least a given area of the substrate.

17. An apparatus according to claim 1, wherein the radiation system supplies the first radiation that is selected from the group consisting of electrons, ions, X-rays and extreme ultra-violet radiation.

18. An apparatus according to claim 1, wherein the secondary source supplies the second radiation which is selected from the group consisting of microwaves, infrared radiation, visible light, and ultra-violet radiation.

19. An apparatus according to claim 1, wherein the pattern controller comprises a stencil plate.

20. An apparatus according to claim 1, wherein the pattern controller comprises:

a programmable memory for storing information regarding a pattern to be projected from the mask;

a beam scanner constructed and arranged to scan a radiation beam from the secondary radiation source over the surface of the substrate; and an attenuator constructed and arranged to adjust the intensity of the secondary radiation source during scanning motion, on the basis of the information stored in the memory, thereby causing patterned irradiation of the substrate with the second radiation.

21. An apparatus according to claim 1, wherein the pattern controller comprises:

a measuring component constructed and arranged to determine the patterned intensity distribution of the first radiation at a reference level between the radiation system and the substrate table; and a second pattern controller constructed and arranged to pattern the output of the secondary radiation source so as to produce a second patterned intensity distribution at substrate level which is substantially a negative of the first patterned intensity distribution determined by the measuring component.

22. An apparatus according to claim 21, wherein the first radiation comprises charged particles; and the measuring component determines the patterned intensity distribution of the charged particles on the basis of a current measurement at the reference level.

23. An apparatus according to claim 21, wherein the first radiation comprises charged particles; and the measuring component determines the patterned intensity distribution of the charged particles on the basis of a secondary electron signal measurement at the reference level.

24. A device manufacturing method comprising:

providing a substrate which is at least partially covered by a layer of radiation-sensitive material;

providing a mask which contains a pattern;

using a projection beam of a first radiation to project an image of at least a part of the mask pattern onto a target area of the layer of radiation-sensitive material; and directing a second radiation onto the substrate according to a certain pattern, such that the sum of the fluxes of the first and second radiations at substrate level causes an elevation of the substrate temperature which is substantially constant across at least a given area of the substrate.

25. A method according to claim 24, wherein said given area is substantially a whole major surface of the substrate.

26. A method according to claim 24, wherein said given area is said target area.

27. A device manufactured using a method according to claim 24.

28. A lithographic projection apparatus according to claim 16, wherein the secondary radiation source is disposed off an optical axis of projection system.

29. A lithographic projection apparatus according to claim 16, wherein the second radiation is coupled into a path of said first radiation.

30. A lithographic projection apparatus according to claim 16, wherein the second radiation is coupled into a path of said first radiation using at least one of a prism and mirror disposed near an optical axis of the projection system.

* * * * *